(12) United States Patent
Jung

(10) Patent No.: US 9,625,769 B2
(45) Date of Patent: Apr. 18, 2017

(54) LIQUID CRYSTAL DISPLAY INCLUDING PROTRUDING AUXILIARY WIRES CORRESPONDING TO SPACER

(71) Applicant: Samsung Display Co., Ltd., Yongin-Si, Gyeonggi-Do (KR)

(72) Inventor: Min-Sik Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/982,266

(22) Filed: Dec. 29, 2015

(65) Prior Publication Data

US 2016/0320673 A1    Nov. 3, 2016

(30) Foreign Application Priority Data

Apr. 30, 2015  (KR) .................. 10-2015-0061604

(51) Int. Cl.

| | |
|---|---|
| H01L 27/14 | (2006.01) |
| H01L 29/04 | (2006.01) |
| H01L 27/15 | (2006.01) |
| H01L 21/00 | (2006.01) |
| G02F 1/1343 | (2006.01) |
| H01L 27/12 | (2006.01) |
| G02F 1/1362 | (2006.01) |

(Continued)

(52) U.S. Cl.
CPC .... *G02F 1/134309* (2013.01); *G02F 1/13394* (2013.01); *G02F 1/13439* (2013.01); *G02F 1/133345* (2013.01); *G02F 1/136286* (2013.01); *H01L 27/124* (2013.01)

(58) Field of Classification Search
CPC ............. H01L 27/124; G02F 1/134309; G02F 1/133345; G02F 1/13394; G02F 1/13439
USPC ........ 257/72, 79, 59; 349/155, 124; 438/155
See application file for complete search history.

(56) References Cited

U.S. PATENT DOCUMENTS

2002/0080320 A1 *  6/2002  Suzuki ............. G02F 1/133707
                                                        349/153
2006/0285060 A1 * 12/2006  Misaki ................ G02F 1/13394
                                                        349/156

(Continued)

FOREIGN PATENT DOCUMENTS

JP         2000-162607 A    6/2000
JP            4266057 B2    2/2009

(Continued)

*Primary Examiner* — Dzung Tran
(74) *Attorney, Agent, or Firm* — Cantor Colburn LLP

(57) ABSTRACT

A liquid crystal display includes: a first substrate and a second substrate facing each other. The first substrate includes a gate line which defines a gate electrode; a passivation layer on the gate line; a pixel in which are disposed, a pixel electrode and a common electrode which overlap each other with an insulating layer therebetween; and a first auxiliary wire and a second auxiliary wire each disposed between the passivation layer and the insulating layer, the first and second auxiliary wires extended parallel to a direction in which the gate line extends, the extended first and second auxiliary wires spaced apart from each other by a gap. The second substrate includes a column spacer. In a plan view a center point of the column spacer of the second substrate is disposed in the gap between the first auxiliary wire and the second auxiliary wire of the first substrate.

17 Claims, 5 Drawing Sheets

(51) Int. Cl.
G02F 1/1339 (2006.01)
G02F 1/1333 (2006.01)

(56) References Cited

U.S. PATENT DOCUMENTS

| | | | |
|---|---|---|---|
| 2009/0289260 A1* | 11/2009 | Sonoda | G02F 1/133723 257/72 |
| 2010/0165278 A1* | 7/2010 | Matsumori | G02F 1/13394 349/123 |
| 2011/0013131 A1* | 1/2011 | Tanaka | G02F 1/133512 349/155 |
| 2012/0268702 A1 | 10/2012 | Imanishi et al. | |
| 2012/0314177 A1 | 12/2012 | Hyodo et al. | |

FOREIGN PATENT DOCUMENTS

| | | |
|---|---|---|
| JP | 2009-282262 A | 12/2009 |
| KR | 1020050113491 A | 12/2005 |
| KR | 1020080048333 A | 6/2008 |
| KR | 1020130070532 A | 6/2013 |

* cited by examiner

LIQUID CRYSTAL DISPLAY INCLUDING PROTRUDING AUXILIARY WIRES CORRESPONDING TO SPACER This application claims priority to Korean Patent Application No. 10-2015-0061604 filed on Apr. 30, 2015, and all the benefits accruing therefrom under 35 U.S.C. §119, the entire contents of which are incorporated herein by reference.

BACKGROUND (a) Field

The invention relates to a liquid crystal display, and more particularly, to a liquid crystal display including column spacers.

(b) Description of the Related Art

A liquid crystal display is one of the most widely used flat panel displays, and is a display device which adjusts the amount of light transmitted therethrough by applying a voltage to an electrode and rearranging liquid crystal molecules of a liquid crystal layer therein.

The liquid crystal display has a merit in that the liquid crystal display is easily manufactured to be relatively thin, but has a drawback in that side visibility thereof is poor compared to front visibility thereof. In order to address the drawback, various methods of arranging and driving the liquid crystal molecules have been developed. A liquid crystal display, in which a pixel electrode and a common electrode are disposed within one display substrate including a single base substrate therein, attracts attention as a method of implementing a relatively wide viewing angle.

SUMMARY

One or more exemplary embodiment of the invention provides a liquid crystal display, which reduces of effectively prevents an alignment layer defect and light leakage due to a movement of a column spacer therein.

An exemplary embodiment of the invention provides a liquid crystal display, including: a first display substrate; and a second display substrate facing the first substrate. The first display substrate includes a gate line which defines a gate electrode on a first base substrate; a passivation layer on the gate line; a pixel in which are disposed on the passivation layer, a pixel electrode and a common electrode which overlap each other with an insulating layer interposed therebetween; a first auxiliary wire and a second auxiliary wire each disposed between the insulating layer which is disposed between the pixel and common electrodes, the first and second auxiliary wires extended parallel to a direction in which the gate line extends, the extended first and second auxiliary wires spaced apart from each other by a gap. The second display substrate includes a column spacer on a second base substrate. In a plan view, a center point of the column spacer of the second display substrate is disposed in the gap between the first auxiliary wire and the second auxiliary wire of the first display substrate.

The liquid crystal display may further include a drain electrode connected with the pixel electrode and overlapping the gate electrode. The passivation layer may define therein a contact hole which exposes the drain electrode, the pixel electrode may be connected with the drain electrode at the contact hole defined by the passivation layer, and in the plan view, the contact hole which exposes the drain electrode may be disposed in the gap between the first auxiliary wire and the second auxiliary wire, and a size of the gap may be larger than a size of the contact hole.

The first auxiliary wire and the second auxiliary wire may overlap the gate electrode and the gate line.

The first auxiliary wire and the second auxiliary wire may include a same material as that of the gate line.

The first auxiliary wire and the second auxiliary wire may have a multilayer structure.

The first auxiliary wire and the second auxiliary wire may have a double layer structure in which titanium (Ti) and copper (Cu) are stacked.

A thickness of each of the first auxiliary wire and the second auxiliary wire may be about 800 angstroms (Å) to about 1,200 Å.

A width of each of the first auxiliary wire and the second auxiliary wire may be about 3 micrometers ($\mu$m) to about 7 $\mu$m.

The gap between the first auxiliary wire and the second auxiliary wire may be about 60% to about 70% of a maximum width of the column spacer.

The gap between the first auxiliary wire and the second auxiliary wire may be about 15 $\mu$m to about 18 $\mu$m.

The liquid crystal display may further include a pixel wire on the insulating layer which is disposed between the pixel and common electrodes. The pixel wire may overlap the first auxiliary wire and the second auxiliary wire, and may be spaced apart from the pixel electrode in the plan view.

The pixel wire may include a first pixel wire which overlaps the first auxiliary wire, and a second pixel wire which overlaps the second auxiliary wire, and the pixel wire may include a same material as that of the pixel electrode.

The pixel wire may overlap the column spacer.

As described above, one or more exemplary embodiment of the liquid crystal display device according to the invention may reduce or effectively prevent an alignment layer defect and light leakage due to a movement of the column spacer by disposing a protrusion using the auxiliary wire in a display substrate which opposes the display substrate of the column spacer.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
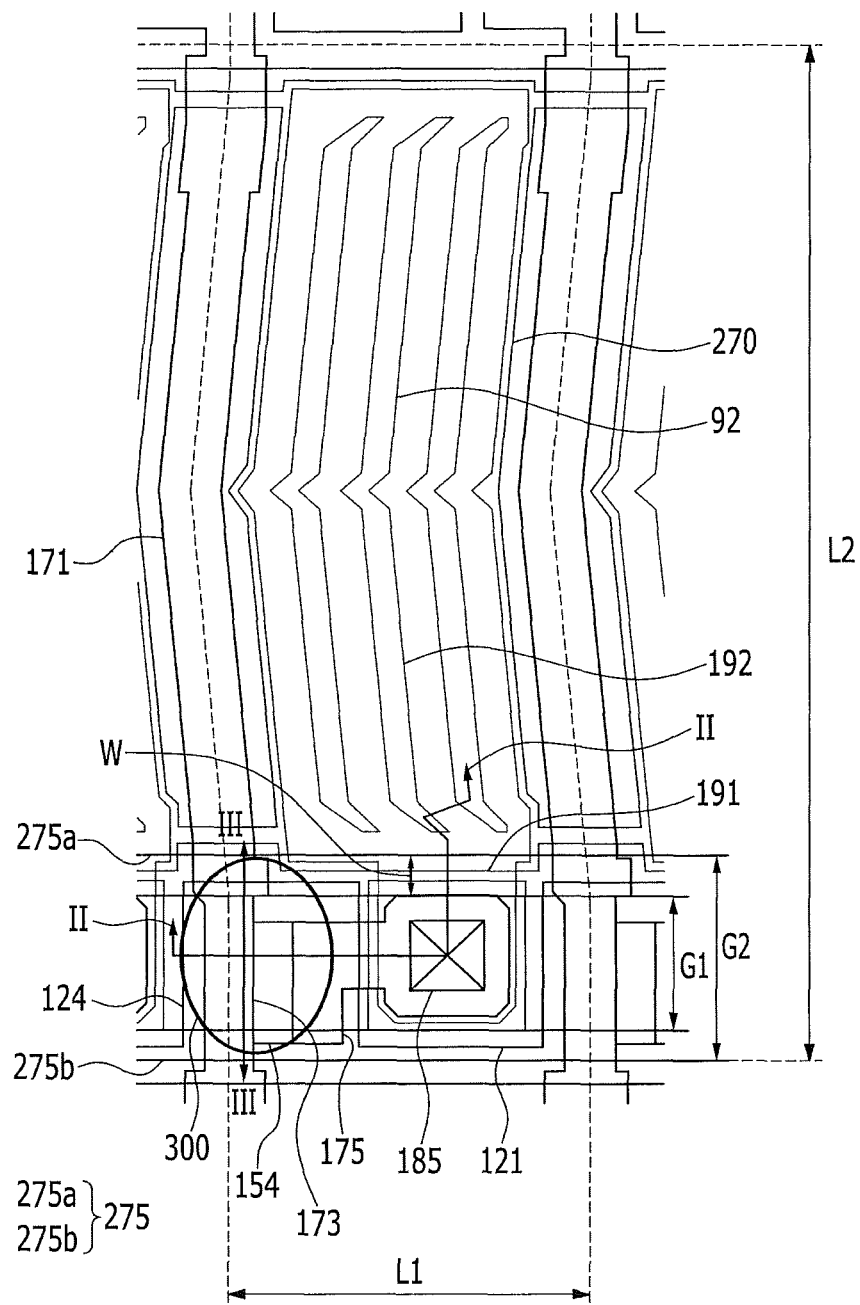
FIG. 1 is a plan view of an exemplary embodiment of a liquid crystal display according to the invention.

The invention will be described more fully hereinafter with reference to the accompanying drawings, in which exemplary embodiments of the invention are shown. As those skilled in the art would realize, the described exemplary embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In a liquid crystal display, a plurality of column spacers which maintains a gap between two display substrates may be mainly disposed in an area such as where a thin film transistor is positioned, between a lower display substrate and an upper display substrate.

When external force is applied to the liquid crystal display, friction may be generated between the column spacers and the display substrate facing the column spacers. As a layer within the facing display substrate, an alignment layer may be torn due to friction generated with the column space to undesirably cause light leakage.

Exemplary embodiments of a liquid crystal display according to the invention will be described with reference to the accompanying drawings.

First, an exemplary embodiment of a liquid crystal display according to the invention will be described with reference to FIGS. 1 to 3.

Figure 2:
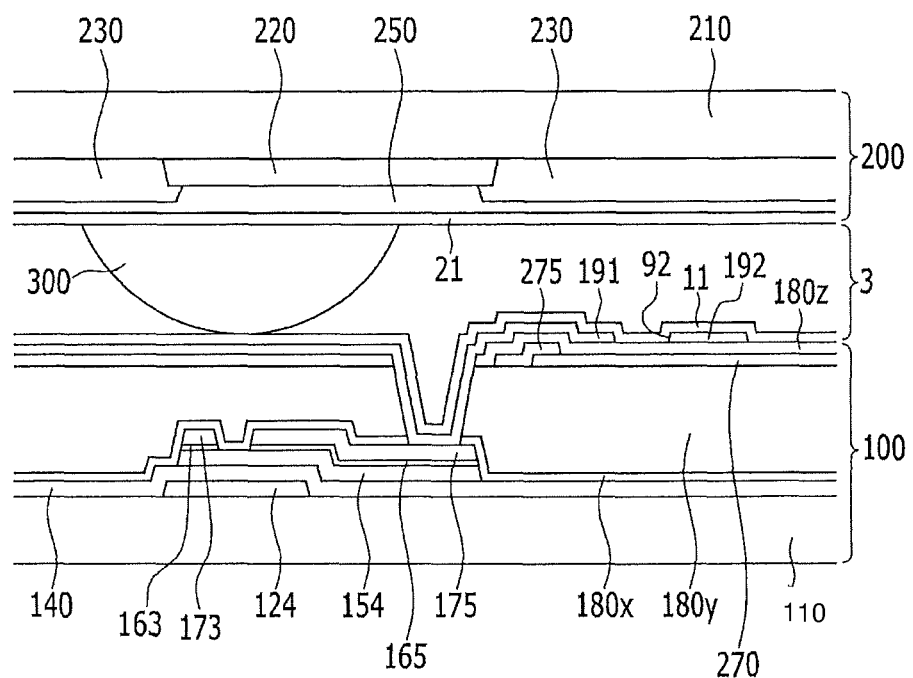
FIG. 2 is a cross-sectional view taken along line II-II of FIG. 1.
Figure 3:
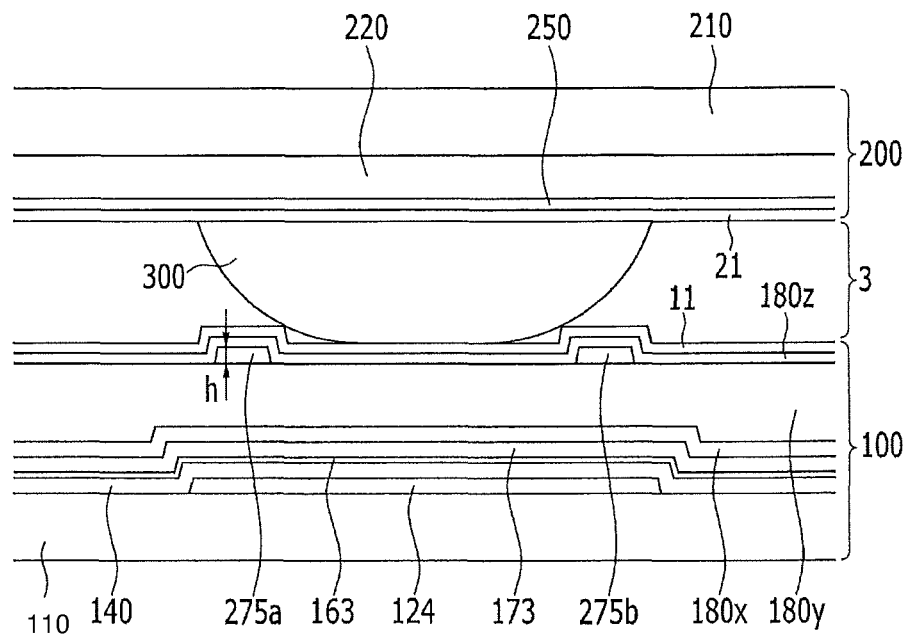
FIG. 3 is a cross-sectional view taken along line III-III of FIG. 1.

FIG. 1 is a plan view of an exemplary embodiment of a liquid crystal display according to the invention, FIG. 2 is a cross-sectional view taken along line II-II of FIG. 1, and FIG. 3 is a cross-sectional view taken along line III-III of FIG. 1.

First, referring to FIGS. 1 to 3, a liquid crystal display includes a lower display substrate 100 and an upper display substrate 200, which face each other, and a liquid crystal layer 3 interposed therebetween. One pixel of the liquid crystal display will be described as an example below, but exemplary embodiments of the liquid crystal display according to the invention include a plurality of pixels defined therein such that the liquid crystal display may have resolution of about 200 pixels per inch ("PPI") or more. That is, about 200 or more pixels may be included in an area of about 1 inch in each dimension (e.g., per square inch) within the liquid crystal display. A pixel may include a pixel area in which an image is displayed, and a pixel non-display area in which the image is not displayed surrounding the pixel (display) area, in a plan view. In addition, a display area of the liquid crystal display (or a display substrate thereof) may include the pixel defined therein.

Further, referring to the plan view of FIG. 1, a horizontal length L1 of one pixel of the exemplary embodiment of the liquid crystal display according to the invention may be about 40 micrometers (μm) or less and a vertical length L2 thereof may be about 120 μm or less. Herein, as illustrated in the drawings, the horizontal length L1 of the pixel means a distance between vertical central portions of two adjacent data lines 171, and the vertical length L2 of the pixel means a gap between horizontal central portions of two adjacent gate lines 121.

First, the lower display substrate 100 will be described.

Gate conductors including a gate line 121 are disposed on a first insulating base substrate 110 including a transparent material such as glass, plastic or the like.

The gate line 121 defines a relatively wide distal end portion (not illustrated) for connection with another layer or an external driving circuit of the liquid crystal display. The gate line 121 transmits a gate signal and a length thereof is mainly extended in a horizontal direction to cross the data line 171 to be described below. A portion of the gate line 121 defines a gate electrode 124.

The gate line 121 may include or be formed of an aluminum-based metal, such as aluminum (Al) or an aluminum alloy, a silver-based metal, such as silver (Ag) or a silver alloy, a copper-based metal, such as copper (Cu) or a copper alloy, a molybdenum-based metal, such as molybdenum (Mo) or a molybdenum alloy, chromium (Cr), tantalum (Ta), and titanium (Ti). The gate line 121 may have a monolayer structure, but the invention is not limited thereto. In an exemplary embodiment, the gate line 121 may have a multilayer structure including at least two conductive material layers having different physical properties from each other.

A gate insulating layer 140 included or formed of a silicon nitride (SiNx), a silicon oxide (SiOx) or the like is disposed on the gate conductors 121. The gate insulating layer 140 may have a monolayer structure or may have a multilayer structure including at least two insulating material layers having different physical properties from each other.

A semiconductor 154 including or made of amorphous silicon, polysilicon or the like is disposed on the gate insulating layer 140. The semiconductor 154 may include an oxide semiconductor, but the invention is not limited thereto.

Ohmic contacts 163 and 165 are disposed on the semiconductor 154. The ohmic contacts 163 and 165 may include or made of a material, such as n+ hydrogenated amorphous silicon doped with an n-type impurity, such as phosphorus, at a relatively high concentration, or silicide. The ohmic contacts 163 and 165 may be disposed as a pair on the semiconductor 154. When the semiconductor 154 is the oxide semiconductor, the ohmic contacts 163 and 165 may be omitted.

Data conductors including the data line 171 and a drain electrode 175 are disposed on the ohmic contacts 163 and 165 and on the gate insulating layer 140. A portion of the data line 171 defines the source electrode 173.

The data line 171 defines a relatively wide distal end portion (not illustrated) for connection with another layer or an external driving circuit of the liquid crystal display. The data line 171 transmits a data signal and a length thereof is mainly extended in a vertical direction to cross the gate line 121.

The data line 171 may have a bent shape in order to obtain maximum transmittance of the liquid crystal display. Inclined portions of the data line 171 may meet each other in a center area of a pixel area to form a V-shape. The data line 171 defines a second portion thereof extended from a first portion thereof so as to form a predetermined angle therebetween at the center area of the pixel area.

The first portion of the data line 171 may be inclined so as to form an angle of about 7 degrees (°) with respect to a vertical reference line (a reference line extending in y-axis direction). The vertical reference line forms an angle of 90° with respect to a horizontal direction (an x-axis direction) in which the gate line 121 is extended. The second portion of the data line 171 extends from the first portion thereof at the center area of the pixel area and forms an angle of about 7° to about 15° with respect to an extension direction (dotted line in FIG. 1) the first portion.

The source electrode 173 is a portion of the data line 171, and a length thereof is disposed on the same extension line (dotted line in FIG. 1) as that of the data line 171. A portion of the drain electrode 175 has a length extended parallel to a length of the source electrode 173. Accordingly, the drain electrode 175 is disposed parallel to a portion of the data line 171.

The gate electrode 124, the source electrode 173 and the drain electrode 175 form a thin film transistor ("TFT") together with the semiconductor 154. A channel of the TFT is formed at an exposed portion of the semiconductor 154 disposed between the source electrode 173 and drain electrode 175.

In the exemplary embodiment of the liquid crystal display according to the invention, since the source electrode 173 is positioned extended along the same extension line as that of the data line 171 and since the drain electrode 175 is extended parallel to the data line 171, a width of the TFT is increased without increasing an overall planar area occupied by the data conductors, thereby increasing an aperture ratio of the liquid crystal display.

The data line 171 and the drain electrode 175 may include or be formed of refractory metal, such as molybdenum, chromium, tantalum and titanium, or an alloy thereof. The data line 171 and the drain electrode 174 may have a monolayer structure, or may have a multilayer structure including a refractory metal material layer (not illustrated) and a low resistance conductive material layer (not illustrated). Examples of the multilayered structure of the data line 171 and the drain electrode 175 may include a double layer structure of a chromium or molybdenum (alloy) lower layer and an aluminum (alloy) upper layer, and a triple layer structure of a molybdenum (alloy) lower layer, an aluminum (alloy) middle layer and a molybdenum (alloy) upper layer. However, the data line 171 and the drain electrode 175 may be made of various metal materials or conductive materials in addition to the above-described examples.

A length of the data line 171 is taken along an extension direction thereof, such as indicated by the dotted line in FIG. 1. A width of the data line 171 is taken perpendicular to the length (e.g., extension direction) thereof. In an exemplary embodiment, the width of the data line 171 may be about 3.5 μm±about 0.75.

A first passivation layer 180x is disposed on the data conductors 171, 173 and 175, on the gate insulating layer 140 and on the exposed portion of the semiconductor 154. The first passivation layer 180x may include or be formed of an organic insulating material, an inorganic insulating material or the like.

A second passivation layer 180y is positioned on the first passivation layer 180x. Here, the second passivation layer 180y may be a color filter, but the invention is not limited thereto. Where the second passivation layer 180y is the color filter, the second passivation layer 180y may intrinsically display any one of the primary colors. Examples of the primary colors may include three primary colors such as red, green and blue or yellow, cyan and magenta, or the like. Although not illustrated in the drawings, the color filter may further include a color filter member which displays a mixed color of the primary colors or white, in addition to color filters individually displaying the primary colors.

A common electrode 270 is disposed on the second passivation layer 180y. The common electrode 270 is disposed within the pixel area. The common electrode 270 may have an overall planar shape and be disposed substantially on an entirety of the first insulating base substrate 110 to define a plate shape thereof. The common electrode 270 may define an opening (not illustrated) therein for which edges of the opening surround the drain electrode 175. That is, the common electrode 270 may have an overall plane plate shape.

Common electrodes 270 positioned in adjacent pixel areas may be connected to each other to each receive a predetermined common voltage supplied from outside a display area of the liquid crystal display.

Further, a conductive auxiliary wire 275 is disposed on the second passivation layer 180y. Two auxiliary wires 275 may be disposed in each pixel, and a length thereof may be extended parallel to the gate line 121.

The auxiliary wire 275 may overlap the common electrode 270, but the invention is not limited thereto. The auxiliary wire 275 may be positioned to overlap the common electrode 270 or may be positioned to not overlap the common electrode 270. That is, a relationship between the common electrode 270 and the auxiliary wire 275 may be varied. The auxiliary wire 275 may be in direct contact with the common electrode 270, but the invention is not limited thereto. The auxiliary wire 275 may be electrically connected with the common electrode 270 at a hole defined in an insulating layer with the insulating layer interposed therebetween, thereby preventing a signal delay of a common voltage which is supplied to the common electrode 270.

The auxiliary wire 275 includes a first auxiliary wire 275a and a second auxiliary wire 275b. The auxiliary wire 275 extends adjacent to an outer side of a contact hole 185 to not overlap the area of the contact hole 185. The auxiliary wire 275 may be disposed spaced apart from a boundary of the contact hole 185. Referring to FIG. 1, the first auxiliary wire 275a may overlap the gate electrode 124, and the second auxiliary wire 275b may overlap a portion of the gate line 121 which defines the gate electrode 124 which is overlapped by the first auxiliary wire 275a.

The auxiliary wire 275 may include or be formed of an aluminum-based metal, such as aluminum (Al) or an aluminum alloy, a silver-based metal, such as silver (Ag) or a silver alloy, a copper-based metal, such as copper (Cu) or a copper alloy, a molybdenum-based metal, such as molybdenum (Mo) or a molybdenum alloy, chromium (Cr), tantalum (Ta), and titanium (Ti). The auxiliary wire 275 may have a monolayer structure, but the invention is not limited thereto. The auxiliary wire 275 may have a multilayer structure including two or more conductive material layers, such as titanium (Ti)/copper (Cu) having different physical properties from each other.

Referring to FIG. 3, a cross-sectional thickness 'h' of the auxiliary wire 275 may be about 800 angstroms (Å) to about 1,200 Å. A length of the auxiliary wire 175 is extended in the horizontal direction and a width is taken perpendicular to the length thereof. Referring to FIG. 1, width 'W' of the auxiliary wire 275 may be about 3 µm to about 7 µm. The thickness 'h' of the auxiliary wire 275 means a protruding height thereof taken from the second passivation layer 180y disposed under the auxiliary wire 275 in a cross-sectional thickness direction. The thickness 'h' may be defined at a maximum protruding height of the auxiliary wire 275. The width 'W' of the auxiliary wire 275 means a shortest distance in a vertical direction of the auxiliary wire 275 in the plan view.

Edges of the first and second auxiliary wires 275a and 275b may face each other in the vertical direction. A gap G1 as a shortest distance between the first auxiliary wire 275a and the second auxiliary wire 275b may be about 15 µm to about 18 µm, but is not limited thereto. In the vertical direction, the gap G1 may be defined as about 60 percent (%) to about 70% of a maximum width of a column spacer 300 disposed in the upper display substrate 200 to be described below. A gap G2 as a maximum distance between outer edges of the first auxiliary wire 275a and the second auxiliary wire 275b is defined in the vertical direction.

A third passivation layer 180z is positioned on the common electrode 270 and on the auxiliary wire 275. The third passivation layer 180z may include or be formed of an organic insulating material, an inorganic insulating material or the like.

A pixel electrode 191 is positioned on the third passivation layer 180z. The pixel electrode 191 includes a curved edge which is substantially parallel to the bent shape defined by the first portion and the second portion of the data line 171. The pixel electrode 191 defines a plurality of cutouts 92 therein. A plurality of branch electrodes 192 is defined by the plurality of cutouts 92.

The contact hole 185, through which the drain electrode 175 is exposed, is defined in the first passivation layer 180x, the second passivation layer 180y and the third passivation layer 180z. The pixel electrode 191 is physically and electrically connected to the drain electrode 175 at the contact hole 185 to receive a voltage from the drain electrode 175.

A first alignment layer 11 may be disposed on the pixel electrode 191 and the third passivation layer 180z. The first alignment layer 11 may be a horizontal alignment layer, and may have an alignment direction in a predetermined direction such as defined by rubbing thereof. However, in another exemplary embodiment of a liquid crystal display according to the invention, a first alignment layer 11 may include an optical reactant to optically align the first alignment layer 11.

The upper display substrate 200 will be described.

A light blocking member 220 is disposed on a second insulating base substrate 210 including a transparent material such as glass, plastic or the like. The light blocking member 220 may also be referred to as a black matrix and reduces or effectively prevents light leakage at the pixel.

A plurality of color filters 230 is also disposed on the second insulating base substrate 210. When the second passivation layer 180y of the lower display substrate 100 is a color filter, the color filter 230 of the upper display substrate 200 may be omitted. Further, the light blocking member 220 of the upper display substrate 200 may be disposed additionally or alternatively in the lower display substrate 100.

An overcoat 250 is disposed on the color filter 230 and on the light blocking member 220. The overcoat 250 may include or be formed of an organic insulating material. The overcoat 250 reduces or effectively prevents exposure of the color filter 230 to other layers of the liquid crystal display and provides a flat surface within the upper display substrate 200. In an exemplary embodiment, the overcoat 250 may be omitted.

The column spacer 300 may be positioned on the overcoat 250. The column spacer 300 uniformly maintains a cell gap in which the liquid crystal layer 3 is disposed between the lower display substrate 100 and the upper display substrate 200.

The column spacer 300 may have a cross-sectional shape of which a width thereof is decreased in a direction from the upper display substrate 200 to the lower display substrate 100, but a cross-sectional shape of the column spacer 300 is not limited thereto. The column spacer 300 may have any of a number of cross-sectional shapes so long as the cell gap is maintained.

In a direction parallel to the second insulating base substrate 210, a width of the column spacer 300 may be about 15 μm to about 30 μm, but is not limited thereto.

The column spacer 300 is disposed at an area corresponding to the data line 171 and the gate electrode 124, and may be substantially positioned between the first auxiliary wire 275a and the second auxiliary wire 275b. That is, a center point of the column spacer 300 is disposed so as to be within a space defined between the first auxiliary wire 275a and the second auxiliary wire 275b. Referring to FIG. 1, in the vertical direction, a maximum dimension of the column spacer 300 may not exceed the gap G2 between the outer edges of the first auxiliary wire 275a and the second auxiliary wire 275b.

The first alignment layer 11 and the third passivation layer 180z are protruded according to the underlying auxiliary wire 275. A cross-sectional thickness of a bump defined by the protruding auxiliary wire 275, third passivation layer 180z and first alignment layer 11 overlaps a cross-sectional thickness of the column spacer 300 at a distal end of the column spacer 300.

In general, when external force is applied to a liquid crystal display including a column spacer, a position of the column spacer may be partially moved. When the column spacer moves, a friction may be generated between the column spacer and the display substrate facing the column spacer. As a layer of the facing display substrate, an alignment layer may be torn or damaged due to the friction generated by the column spacer, thereby causing light leakage at the pixel. Particularly, the friction may influence the pixel area, in which a pixel electrode is positioned, and a display quality defect may be undesirably caused.

In one or more exemplary embodiment of the liquid crystal display according to the invention, the auxiliary wire 275 protruding with the thickness 'h' is disposed at a position corresponding to the column spacer 300 of the lower display substrate 100 which faces the column spacer 300. In detail, the auxiliary wire 275 is disposed at opposing sides of the column spacer 300, thereby restricting movement of the column spacer 300 by the external force applied to a liquid crystal display. That is, the auxiliary wire 275 of which portions thereof are disposed at opposing sides of the column spacer 300 may serve as a blocking bump for blocking a movement of the column spacer 300. Where movement of the column spacer 300 is blocked by the protruding auxiliary wire 275, a display quality defect due to the friction between the column spacer 300 and the facing lower display substrate 100 may be reduced or effectively prevented.

The thickness 'h' of the auxiliary wire 275, which forms the blocking bump for restricting a movement of the column spacer 300, may be about 800 Å to about 1,200 Å since when the thickness 'h' is smaller than 800 Å, the thickness is so small that there is little to no effect of restricting a movement of the column spacer 300. Conversely, when the thickness is larger than 1,200 Å, the first alignment layer 11 on the auxiliary wire 275 is relatively easily torn due to the friction between the column spacer 300 and the first alignment layer 11 on the auxiliary wire 275.

The width 'W' of the auxiliary wire 275 may be about 3 μm to about 7 μm since when the width 'W' is equal to or larger than 7 μm, the auxiliary wire 275 may occupy a relatively large planar area in the pixel area, so that the aperture ratio of the liquid crystal display may be decreased.

Further, the gap G1 between inner edges of the auxiliary wires 275 may be about 15 μm to about 18 μm since when the gap G1 is smaller than 15 μm, the auxiliary wire 275 may extend to overlap the contact hole 185. When the gap G1 is equal to or larger than 18 μm, a distance between the first auxiliary wire 275a and the second auxiliary wire 275b is too large, so that there is little to no effect of restricting a movement of the column spacer 300. However, the gap G1 between inner edges of the auxiliary wires 275 is not limited thereto, and may be defined as 60 to 70% of the maximum width of the column spacer 300. When the auxiliary wire 275 is defined exceeding 70% of the maximum width of the column spacer 300, there is little to no effect of restricting a movement of the column spacer 300, and when the auxiliary wire 275 is defined smaller than 60% of the maximum width of the column spacer 300, the auxiliary wire 275 is pressed by the column spacer 300, so that a tearing phenomenon of the overlying alignment layer 11 may become severe.

A second alignment layer 21 may be disposed on the overcoat 250 and the column spacer 300. The second alignment layer 21 may be a horizontal alignment layer, and may have an alignment direction in a predetermined direction such as by being rubbed in the predetermined direction. However, in another exemplary embodiment of a liquid crystal display according to the invention, a second alignment layer 21 may include an optical reactant to optically align the second alignment layer 21.

The liquid crystal layer 3 includes a nematic liquid crystal material having positive dielectric anisotropy. Liquid crystal molecules of the liquid crystal layer 3 are arranged so that a direction of long axes thereof is parallel to the display substrates 100 and 200, and the liquid crystal layer 3 has a spiral structure twisted 90° from a rubbing direction of one or more alignment layer in a direction from the lower display substrate 100 to the upper display substrate 200.

The pixel electrode 191 receives a data voltage from the drain electrode 175, and the common electrode 270 receives a common (reference) voltage having a predetermined size such as from a (reference) voltage applying unit disposed outside the display area of the liquid crystal display.

The pixel electrode 191 and the common electrode 270, which are the field generating electrodes of the liquid crystal display, generate an electric field in the liquid crystal layer 3, so that liquid crystal molecules of the liquid crystal layer 3 positioned on the two electrodes 191 and 270 rotate in a direction parallel to a direction of the electric field. Polarization of light passing through the liquid crystal layer is varied according to the rotation direction of the liquid crystal molecules determined as described above.

Another exemplary embodiment of a liquid crystal display according to the invention will be described.

Figure 4:
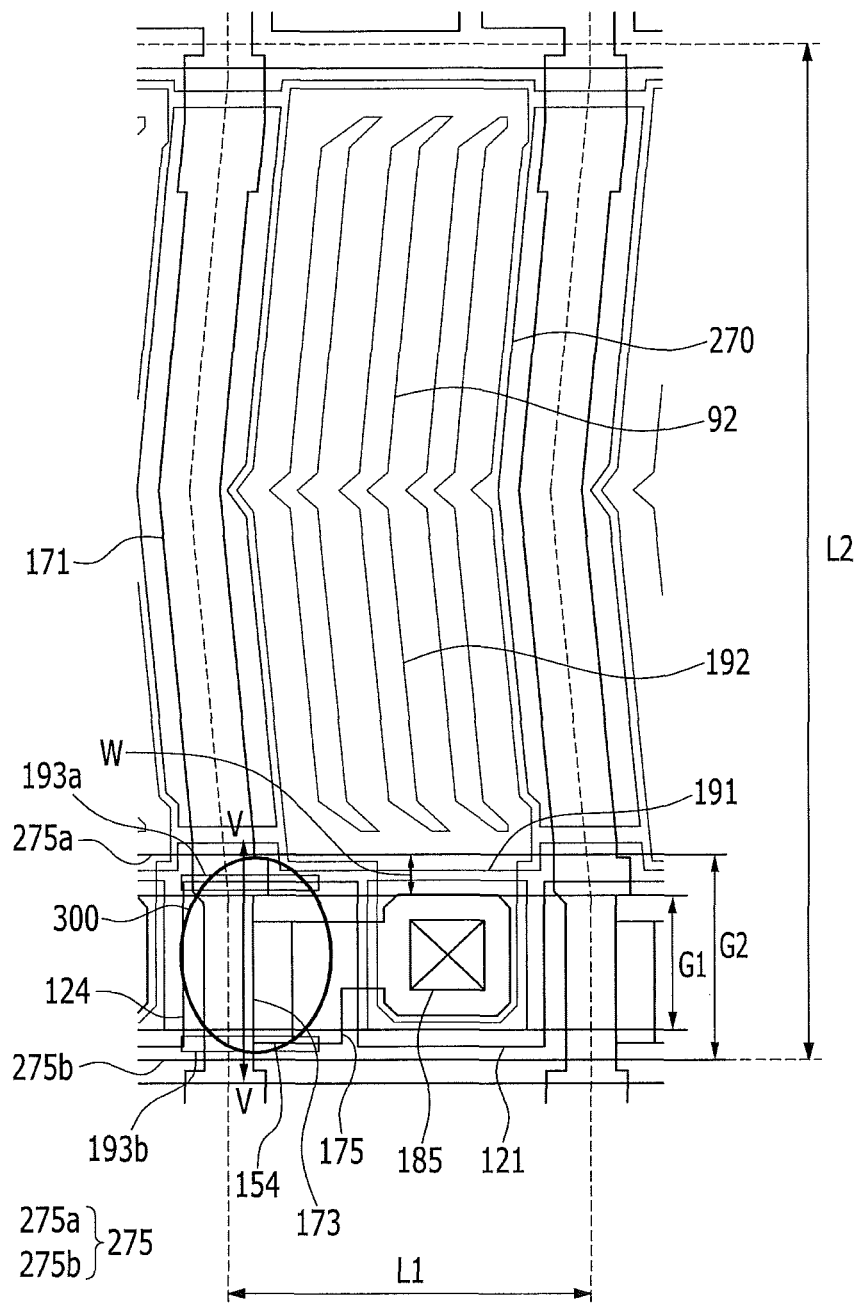
FIG. 4 is a plan view of another exemplary embodiment of a liquid crystal display according to the invention.
Figure 5:
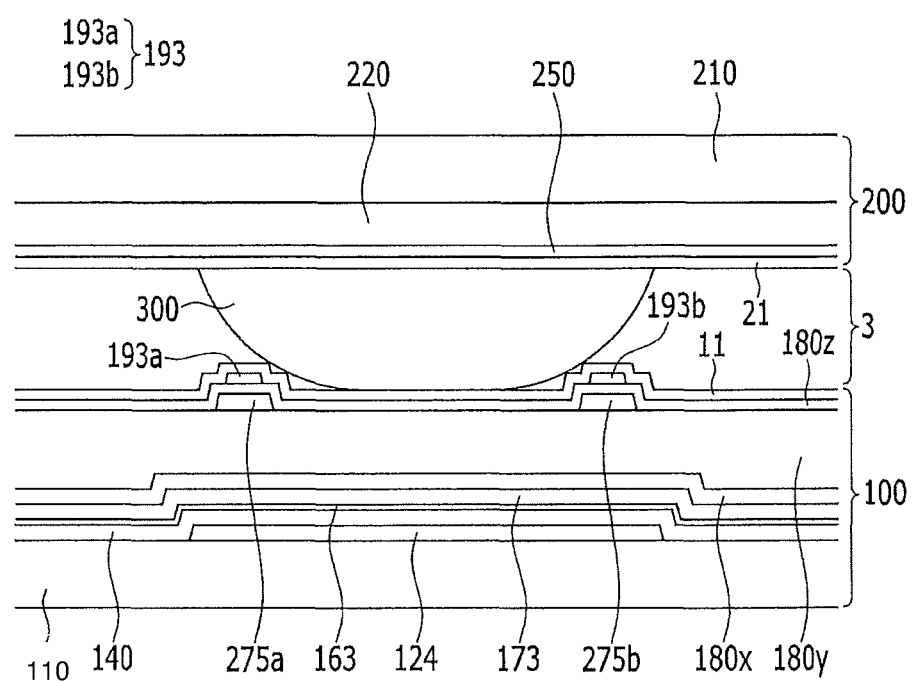
FIG. 5 is a cross-sectional view taken along line V-V of FIG. 4.

FIG. 4 is a plan view of another exemplary embodiment of a liquid crystal display according to the invention, and FIG. 5 is a cross-sectional view taken along line V-V of FIG. 4.

The exemplary embodiment of a liquid crystal display illustrated in FIGS. 4 and 5 is substantially the same as the exemplary embodiment illustrated in FIGS. 1 to 3, except for a pixel wire 193 disposed on an auxiliary wire 275, so that overlapping descriptions of elements with same reference numerals will be omitted.

Referring to FIGS. 4 and 5, in the exemplary embodiment of the liquid crystal display according to the invention, the pixel wire 193, which overlaps the auxiliary wire 275 which is disposed on a third passivation layer 180z, is disposed in an area corresponding to the column spacer 300. The pixel wire 193 is disposed to be spaced apart from the pixel electrode 191 in the plan view.

The pixel wire 193 may include a first pixel wire 193a and a second pixel wire 193b, which are spaced apart from each other. The first pixel wire 193a and the second pixel wire 193b are spaced apart from the pixel electrode 191, thereby not receiving a voltage. The pixel wire 193 as a discrete element not electrically connected to another element of the liquid crystal display, may be considered as electrically floating.

The first alignment layer 11 and the third passivation layer 180z are protruded according to the underlying auxiliary wire 275 and pixel wire 193. A cross-sectional thickness of a bump defined by the protruding auxiliary wire 275, third passivation layer 180z, pixel wire 193 and first alignment layer 11 overlaps a cross-sectional thickness of the column spacer 300 at a distal end of the column spacer 300.

In an exemplary embodiment of manufacturing the liquid crystal display, among layers of the lower display substrate 100 disposed on the first insulating base substrate 110, the pixel wire 193 may be simultaneously formed in and/or on a same layer as that of the pixel electrode 191 when the pixel electrode 191 is formed. Thus, the pixel wire 193 may include or be formed of the same material as that of the pixel electrode 191. The pixel wire 193 may include or be formed of indium tin oxide ("ITO"), indium zinc oxide ("IZO") or the like.

When the pixel wire 193 is disposed in addition to the auxiliary wire 275, the auxiliary wire 275 may have a thickness 'h' smaller than that of the aforementioned exemplary embodiment illustrated in FIGS. 1 to 3. In the liquid crystal display including the pixel wire 193 overlapping the auxiliary wire 275, a sum of the thicknesses of the auxiliary wire 275 and the pixel wire 193 may be about 800 Å to about 1,200 Å.

Hereinafter, a result of an experiment of generation of light leakage according to the thickness 'h' and width 'W' of the auxiliary wire 275, and generation of light leakage according to the gap G1 between the auxiliary wires 275 will be described with reference to Tables 1 and 2.

TABLE 1

| Thickness (Å) | Width (μm) | Generation of light leakage |
|---|---|---|
| 500 | 3 | Yes |
| 500 | 7 | Yes |
| 1000 | 3 | No |
| 1000 | 7 | No |
| 1500 | 3 | Yes |
| 1500 | 7 | Yes |

TABLE 2

| Distance between auxiliary wires (μm) | Generation of light leakage |
|---|---|
| 15 | No |
| 17 | No |
| 20 | Yes |

First, as represented in Table 1, it can be seen that when the thickness 'h' of the auxiliary wire 275 is 500 Å or 1,500 Å, light leakage is generated by friction according to a movement of the column spacer 300, but when the thickness 'h' of the auxiliary wire 275 is 1,000 Å, light leakage is not generated.

Next, as represented in Table 2, it can be seen that when the gap G1 between the auxiliary wires 275 is 20 μm, light leakage is generated by friction according to a movement of the column spacer 300, but when the gap G1 between the auxiliary wires 275 is 15 μm and 17 μm, light leakage is not generated.

Considering that a size of the contact hole 185 may be about 15 μm, when the gap G1 between the auxiliary wires 275 is smaller than 15 μm, the auxiliary wire 275 may be positioned to extend to an inner side of an edge of the contact hole 185. Accordingly, the gap G1 between the auxiliary wires 275 may be 15 μm or more so that the auxiliary wire 275 does not extend to overlap the contact hole 185.

As described above, one or more exemplary embodiment of the liquid crystal display device according to the invention may reduce or effectively prevent a defect in an alignment layer by a movement of the column spacer by forming a protrusion using the auxiliary wire in a display substrate which faces that of the column spacer.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:
1. A liquid crystal display, comprising:
   a first display substrate comprising:
      a gate line which defines a gate electrode on a first base substrate;
      a passivation layer on the gate line;
      a pixel in which are disposed on the passivation layer, a pixel electrode and a common electrode which overlap each other with an insulating layer therebetween; and
      a first auxiliary wire and a second auxiliary wire each disposed between the passivation layer and the insulating layer which is disposed between the pixel and common electrodes, the first and second auxiliary wires extended parallel to a direction in which the gate line extends, the extended first and second auxiliary wires spaced apart from each other by a gap; and
   a second display substrate facing the first display substrate, the second display substrate comprising a column spacer on a second base substrate,
   wherein in a plan view a center point of the column spacer of the second display substrate is disposed in the gap between the first auxiliary wire and the second auxiliary wire of the first display substrate.

2. The liquid crystal display of claim 1, further comprising:
   a drain electrode connected with the pixel electrode and overlapping the gate electrode,
   wherein
   the passivation layer defines a contact hole which exposes the drain electrode which is connected with the pixel electrode and overlaps the gate electrode,
   the pixel electrode is connected with the drain electrode at the contact hole defined by the passivation layer, and
   in the plan view, the contact hole which exposes the drain electrode is disposed in the gap between the first auxiliary wire and the second auxiliary wire, and
a size of the gap is larger than a size of the contact hole.

3. The liquid crystal display of claim 2, wherein:
the first auxiliary wire and the second auxiliary wire overlap the gate electrode and the gate line defined thereby.

4. The liquid crystal display of claim 1, wherein:
the first auxiliary wire and the second auxiliary wire include a same material as that of the gate line.

5. The liquid crystal display of claim 4, wherein:
the first auxiliary wire and the second auxiliary wire have a multilayer structure.

6. The liquid crystal display of claim 5, wherein:
the first auxiliary wire and the second auxiliary wire have a double layer structure in which titanium (Ti) and copper (Cu) are stacked.

7. The liquid crystal display of claim 2, wherein:
a thickness of each of the first auxiliary wire and the second auxiliary wire is about 800 angstroms to about 1,200 angstroms.

8. The liquid crystal display of claim 7, wherein:
a width of each of the first auxiliary wire and the second auxiliary wire is about 3 micrometers to about 7 micrometers.

9. The liquid crystal display of claim 2, wherein:
the gap between the first auxiliary wire and the second auxiliary wire is about 60% to about 70% of a maximum width of the column spacer.

10. The liquid crystal display of claim 9, wherein:
the gap between the first auxiliary wire and the second auxiliary wire is about 15 micrometers to about 18 micrometers.

11. The liquid crystal display of claim 2, further comprising:
a pixel wire on the insulating layer which is disposed between the pixel and common electrodes,
wherein the pixel wire overlaps the first auxiliary wire and the second auxiliary wire and is spaced apart from the pixel electrode in the plan view.

12. The liquid crystal display of claim 11, wherein:
the pixel wire includes:
a first pixel wire which overlaps the first auxiliary wire, and
a second pixel wire which overlaps the second auxiliary wire, and
the pixel wire includes a same material as that of the pixel electrode.

13. The liquid crystal display of claim 12, wherein:
the pixel wire overlaps the column spacer.

14. The liquid crystal display of claim 12, wherein:
a sum of thicknesses of the first auxiliary wire and the pixel wire and of the second auxiliary wire and the pixel wire is about 800 angstroms to about 1,200 angstroms.

15. The liquid crystal display of claim 14, wherein:
a width of each of the first auxiliary wire, the second auxiliary wire, and the pixel wire is about 3 micrometers to about 7 micrometers.

16. The liquid crystal display of claim 12, wherein:
the gap between the first auxiliary wire and the second auxiliary wire is about 60% to about 70% of a maximum width of the column spacer, and
the first pixel wire and the second pixel wire are disposed in the gap which is about 60% to about 70% of the maximum width of the column spacer.

17. The liquid crystal display of claim 1, wherein:
the extended first and second auxiliary wires spaced apart from each other by the gap are respectively disposed at opposing sides of a distal end of the column spacer.

* * * * *